United States Patent
Jelinek et al.

(10) Patent No.: US 10,096,677 B2
(45) Date of Patent: Oct. 9, 2018

(54) METHODS FOR FORMING A SEMICONDUCTOR DEVICE AND A SEMICONDUCTOR DEVICE

(71) Applicant: Infineon Technologies AG, Neubiberg (DE)

(72) Inventors: Moriz Jelinek, Villach (AT); Naveen Goud Ganagona, Villach (AT); Johannes Georg Laven, Taufkirchen (DE); Hans-Joachim Schulze, Taufkirchen (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 15/178,039

(22) Filed: Jun. 9, 2016

(65) Prior Publication Data

US 2016/0372329 A1 Dec. 22, 2016

(30) Foreign Application Priority Data

Jun. 17, 2015 (DE) .......... 10 2015 109 661

(51) Int. Cl.
*H01L 21/265* (2006.01)
*H01L 29/10* (2006.01)
(Continued)

(52) U.S. Cl.
CPC ........ *H01L 29/1095* (2013.01); *H01L 21/263* (2013.01); *H01L 21/26506* (2013.01);
(Continued)

(58) Field of Classification Search
None
See application file for complete search history.

(56) References Cited

U.S. PATENT DOCUMENTS 4,004,950 A * 1/1977 Baruch .................. H01L 21/22
257/104
2012/0315747 A1 12/2012 Mauder
2014/0374793 A1 12/2014 Miyazaki

FOREIGN PATENT DOCUMENTS

DE          259 715 A1    8/1988
DE    10 2006 046 844 A1    4/2008
WO    WO 2007/085387    8/2007

OTHER PUBLICATIONS

Office Action communication of the German Patent and Trademark Office for Appln. Ser. No. 102015109661.7, dated Oct. 3, 2016.
(Continued)

*Primary Examiner* — Long Pham
(74) *Attorney, Agent, or Firm* — Slater Matsil, LLP

(57) ABSTRACT

A method for forming a semiconductor device includes implanting a predefined dose of protons into a semiconductor substrate. Further, the method comprises controlling a temperature of the semiconductor substrate during the implantation of the predefined dose of protons so that the temperature of the semiconductor substrate is within a target temperature range for more than 70% of an implant process time used for implanting the predefined dose of protons. The target temperature range reaches from a lower target temperature limit to an upper target temperature limit. Further, the lower target temperature limit is equal to a target temperature minus 30° C. and the upper target temperature limit is equal to the target temperature plus 30° C. and the target temperature is higher than 80° C.

19 Claims, 10 Drawing Sheets

(51) Int. Cl.
     H01L 29/66    (2006.01)
     H01L 29/167   (2006.01)
     H01L 29/08    (2006.01)
     H01L 21/263   (2006.01)
     H01L 21/324   (2006.01)
     H01L 21/67    (2006.01)
     H01L 21/66    (2006.01)
     H01L 29/32    (2006.01)
     H01L 29/861   (2006.01)

(52) U.S. Cl.
     CPC ........ *H01L 21/324* (2013.01); *H01L 21/3242* (2013.01); *H01L 21/67248* (2013.01); *H01L 29/0878* (2013.01); *H01L 29/167* (2013.01); *H01L 29/6609* (2013.01); *H01L 29/66666* (2013.01); *H01L 29/66712* (2013.01); H01L 22/26 (2013.01); H01L 29/32 (2013.01); H01L 29/861 (2013.01)

(56) References Cited

OTHER PUBLICATIONS

J.G. Laven et al. "Deep Doping Profiles in Silicon Created by MeV Hydrogen Implantation: Influence of Implantation Parameters" Ion Implantation Technology, American Institute of Physics, 2010.

\* cited by examiner

US 10,096,677 B2

METHODS FOR FORMING A SEMICONDUCTOR DEVICE AND A SEMICONDUCTOR DEVICE

CROSS-REFERENCE TO RELATED APPLICATION

This application claims priority to German Application Serial No. 102015109661.7 filed Jun. 17, 2015 and entitled "Methods for Forming a Semiconductor Device and a Semiconductor Device."

TECHNICAL FIELD

Embodiments relate to implantation processes during forming semiconductor devices and corresponding doping distributions and in particular to methods for forming semiconductor devices and semiconductor devices.

BACKGROUND

Nowadays, semiconductor devices have a plurality of different doping regions of different conductivity type and/or different doping concentrations. Such doping regions can be implemented in various ways. For example, protons can be implanted into a semiconductor substrate to generate hydrogen-related donors. Many semiconductor devices require regions of high doping concentrations. Such doping concentrations may be reached by high beam currents during the implantation or long implant process times. This increases the manufacturing costs due to the required expensive equipment and/or the long manufacturing times.

SUMMARY

There may be a demand for providing a concept for forming semiconductor devices, which allows to reduce the costs and/or to increase the implantation efficiency.

Such a demand may be satisfied by the subject matter of the claims.

Some embodiments relate to a method for forming a semiconductor device. The method comprises implanting a predefined dose of protons into a semiconductor substrate. Further, the method comprises controlling a temperature of the semiconductor substrate during the implantation of the predefined dose of protons so that the temperature of the semiconductor substrate is within a target temperature range for more than 70% of an implant process time used for implanting the predefined dose of protons. The target temperature range reaches from a lower target temperature limit to an upper target temperature limit. Further, the lower target temperature limit is equal to a target temperature minus 30° C. and the upper target temperature limit is equal to the target temperature plus 30° C. and the target temperature is higher than 80° C.

Some embodiments relate to a method for forming a semiconductor device. The method comprises implanting a predefined dose of protons into a semiconductor substrate with an implantation energy of less than 2.5 MeV. Further, the method comprises controlling a temperature of the semiconductor substrate during the implantation of the predefined dose of protons so that the temperature of the semiconductor substrate is higher than 80° C. for more than 70% of an implant process time used for implanting the predefined dose of protons.

Some embodiments relate to a method for forming a semiconductor device. The method comprises implanting a predefined dose of protons into a semiconductor substrate and measuring a temperature of the semiconductor substrate during the implantation of the predefined dose of protons. Further, the method comprises adjusting a beam current of the protons during the implantation based on the measured temperature.

Some embodiments relate to a semiconductor device comprising a first region within a semiconductor substrate. The first region comprises a maximal concentration of hydrogen-related donors within the semiconductor substrate caused by a proton implant. Further, the first region is located at a first depth with respect to a first surface of the semiconductor substrate. Additionally, the semiconductor device comprises a second region within the semiconductor substrate located at a second depth with respect to the first surface of the semiconductor substrate. The first depth is twice the second depth and the second region comprises a concentration of hydrogen-related donors caused by the proton implant of less than 20% of the maximal concentration of hydrogen-related donors.

BRIEF DESCRIPTION OF THE FIGURES

Some embodiments of apparatuses and/or methods will be described in the following by way of example only, and with reference to the accompanying figures, in which.

DETAILED DESCRIPTION

Figure 1:
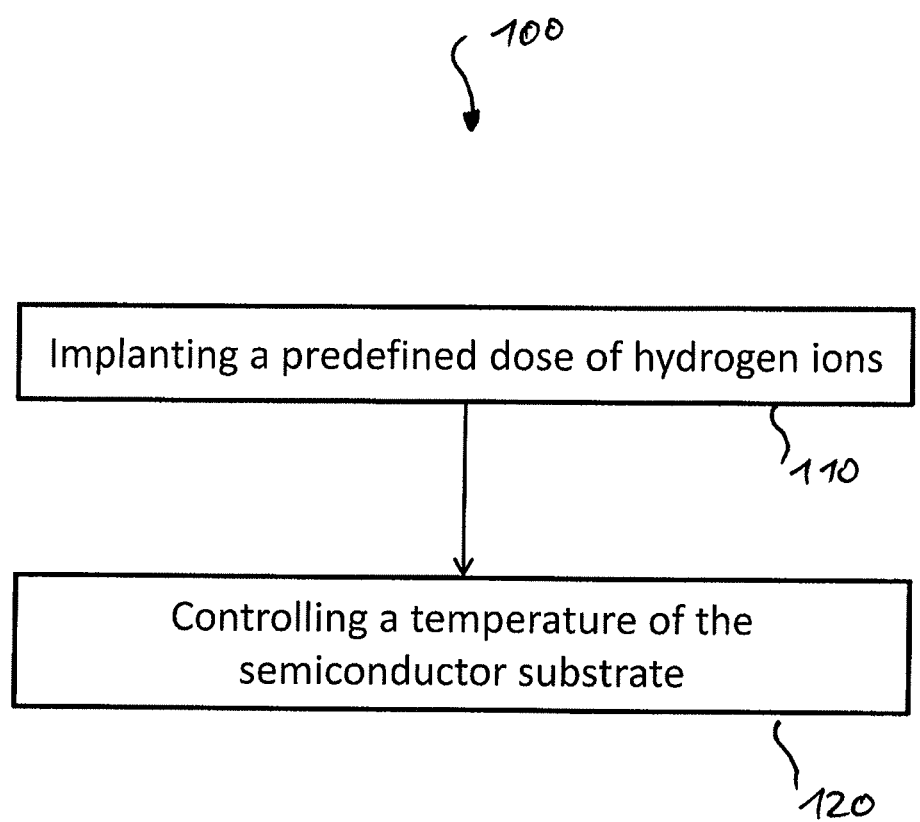
FIG. 1 shows a flow chart of a method for forming a semiconductor device.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Hydrogen-related donors (HDs) can be generated by implanting protons (hydrogen ions) into a semiconductor substrate. For example, irradiation of crystalline silicon with protons in the energy range of keV to MeV and successive annealing at temperatures up to 500° C. induces shallow donor type defects with ionization energies of several 10 meV. Various different energy levels may exist, depending on the temperature of a later annealing step. For the hydrogen-related donors (HDs) to appear, crystal damage and hydrogen may coincide in the semiconductor sample. In the case of proton implantation, the radiation damage and the hydrogen may be inserted simultaneously. The damage profile generated by the irradiation with protons in the energy range of keV to MeV may extend to several 10 nm to several 100 µm, e.g. 200 µm below the surface, while the majority of the implanted protons may come to rest around their projected range near the end of the damage profile (end of range, EOR). For example, implantation energies of less than 10 MeV (or less than 6 MeV, less than 4 MeV, less than 2.5 MeV or less than 1.5. Mev) may be used to form desired doping regions within a semiconductor substrate. For example, implantation energies of up to 10 MeV may be used for implementing a doping of a drift zone region of a transistor structure or a diode structure. Alternatively or additionally, implantation energies of approximately 4 MeV (e.g. between 3 MeV and 5 MeV) may be used for implementing a base region of a transistor structure from a front side of a semiconductor substrate. Further, alternatively or additionally, implantation energies of less than 2.5 MeV (or below 1.6 MeV) may be used for implementing a field stop region of a transistor structure or a diode structure from a back side of a semiconductor substrate. For example, implantation energies higher than 200 keV (or higher than 300 keV or higher than 400 keV) may be used.

FIG. 1 shows a flow chart of a method 100 for forming a semiconductor device according to an embodiment. The method 100 comprises implanting 110 a predefined dose of protons into a semiconductor substrate with an implantation energy of less than 2.5 MeV (2500 keV). Further, the method 100 comprises controlling 120 a temperature of the semiconductor substrate during the implantation of the predefined dose of protons so that the temperature of the semiconductor substrate is higher than 80° C. for more than 70% of an implant process time used for implanting the predefined dose of protons.

The doping efficiency of the implanted protons may be increased by increasing the temperature higher than 80° C. during the implant. In this way, a maximally reachable doping concentration may be increased and/or the process time required for implanting a desired dose of ions or for obtaining a desired doping concentration may be reduced. Further, the manufacturing costs may be reduced.

The protons can be accelerated by an ion implantation system to a desired energy. For example, the protons are accelerated to implantation energy of less than 2.5 MeV. The temperature of the semiconductor substrate may stay low (e.g. below 60° C.) at implantation energies of less than 2.5 MeV, if the temperature of the semiconductor substrate is not controlled (e.g. heating semiconductor substrate). The implantation energy of the protons may determine the depth of penetration and the doping profile in a vertical direction. For example, the implantation energy may be selected according to a desired depth of a maximum of hydrogen-related donors generated based on the implanted protons or an end of range of the implanted protons. For example, an implant energy of less than 1.6 MeV (1600 keV) may be sufficient for implementing doping regions (e.g. field stop region or drift region) of various electrical elements (e.g. transistor structure or diode structure). For example, implantation energies higher than 200 keV (or higher than 300 keV or higher than 400 keV) may be used.

For example, the semiconductor substrate may be a semiconductor wafer, a part of a semiconductor wafer or a semiconductor die. The semiconductor substrate of the semiconductor device may be a silicon substrate or silicon wafer. Alternatively, the semiconductor substrate of the semiconductor device may be a silicon carbide substrate, a gallium arsenide substrate or a gallium nitride substrate, for example.

The predefined dose of protons to be implanted may be selected according to a desired doping profile or doping distribution within the semiconductor substrate of the semiconductor device to be formed. For example, a base doping of the semiconductor substrate or a doping region (e.g. field stop region) of an electrical element (e.g. transistor or diode) may be implemented by implanting the predefined dose of protons.

The temperature of the semiconductor substrate may be controlled 120 in various ways. For example, a substrate carrier (e.g. carrying the semiconductor substrate during the proton implant) may comprise a means for heating and/or cooling the semiconductor substrate (e.g. integrated heater device and/or cooling device) during the implantation of the protons. Additionally or alternatively, the implantation system used for implanting the protons may comprise a process chamber with a controllable temperature so that the temperature within the process chamber can be controlled during the proton implant. For example, the temperature of the semiconductor substrate may be measured (e.g. by a temperature sensor at the semiconductor substrate or by infrared temperature measurement) during the implantation of the predefined dose of protons and the temperature of the semiconductor substrate may be adjusted (e.g. by adjusting a heat power of a means for heating and/or cooling the semiconductor substrate and/or by adjusting a beam current of the protons) based on the measured temperature. For example, more than 70% (or more than 80% or more than 90%) of the heating energy provided to the semiconductor substrate to heat the substrate to a desired target temperature range may be provided by means for heating the semiconductor substrate additionally to a heating energy generated by the beam of protons, if the implantation energies are below 2.5 MeV.

The temperature of the semiconductor substrate is kept above 80° C. during more than 70% of an implant process time used for implanting the predefined dose of protons. The implant process time may be a time during which the semiconductor substrate is irradiated by a beam of protons contributing to the predefined dose of protons to be implanted. The predefined dose of protons may be implanted during one uninterrupted implant process. In this case, the implant process time may start when the proton beam is turned on and may end when the proton beam is turned off and the predefined dose of protons is implanted. Alternatively, the predefined dose of protons may be implanted during two or more implant sub-processes interrupted by implant breaks. In this case, the implant process time may be the summated time (e.g. beam time) during which the proton beam is turned on without adding the time of the implant breaks. The reason for the implant breaks may be to avoid uncontrolled self-heating effects.

An improvement of the doping efficiency of the implanted protons may be experienced already at temperatures higher than 80° C. The effect may be increased by selecting higher substrate temperatures during the proton implant. For example, the temperature of the semiconductor substrate may be kept above 120° C. (or above 150° C. or above 200° C. or above 250° C.) for more than 70% of the implant process time used for implanting the predefined dose of protons.

Further, the semiconductor substrate may be kept below temperatures, which would destroy hydrogen-related donors or would reduce the efficiency for generating hydrogen-related donors. For example, the temperature of the semiconductor substrate may be kept below 500° C. (or below 400° C. or below 300° C.) during the during the implantation of the predefined dose of protons.

The semiconductor substrate may be heated from room temperature to a target temperature or a target temperature range higher than 80° C. at the beginning of the implant (e.g. during the implant process time) so that the semiconductor substrate is not higher than 80° C. during the whole implant process time, but for more than 70% of the implant process time used for implanting the predefined dose of protons. Alternatively, the semiconductor substrate may be heated to a target temperature or a target temperature range higher than 80° C. before the beginning of the implant of the protons. In this way, the temperature of the semiconductor substrate may be temperatures higher than 80° C. for the whole or nearly the whole implant process time. For example, the temperature of the semiconductor substrate is controlled so that the temperature of the semiconductor substrate is higher than 80° C. for more than 90% (or more than 95% or more than 99%) of the implant process time used for implanting the predefined dose of protons.

Figure 2:
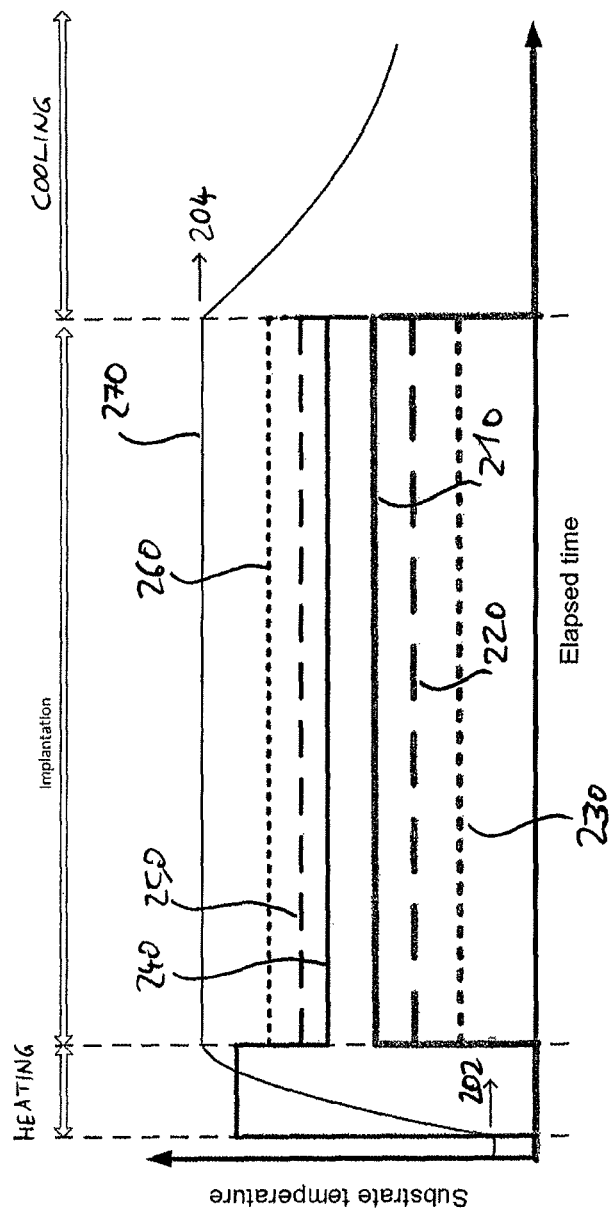
FIG. 2 shows a schematic illustration of a substrate temperature profile with temperature control.
Figure 3:
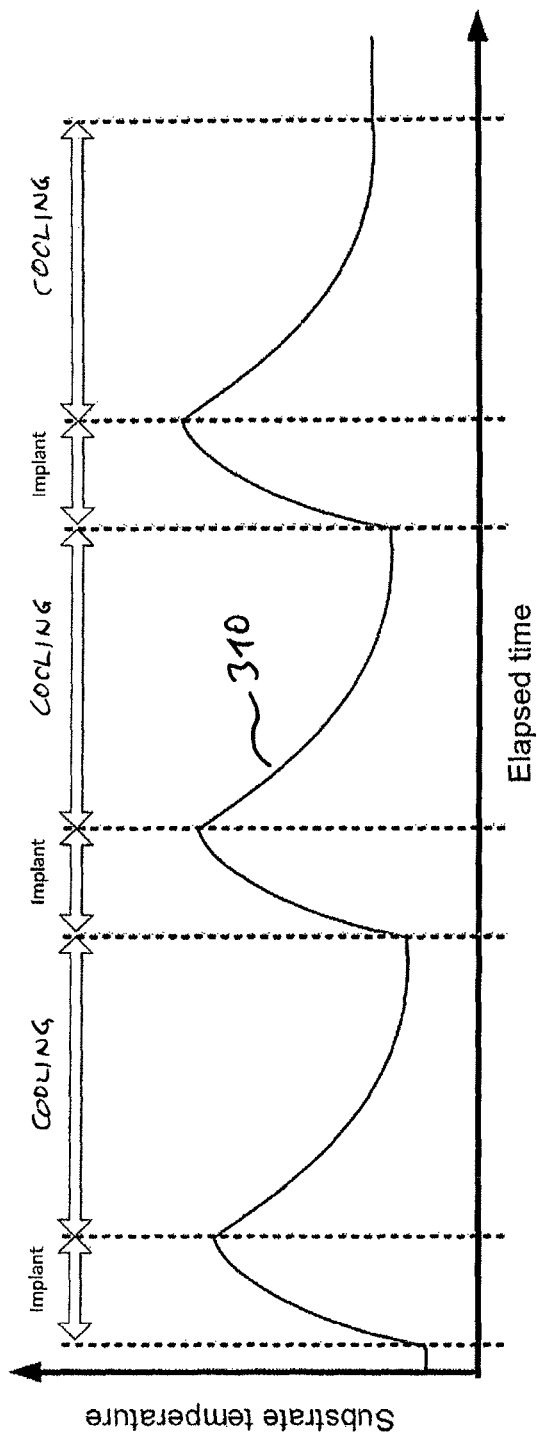
FIG. 3 shows a schematic illustration of a substrate temperature profile without temperature control.

FIG. 2 shows an example of a temperature profile 270 of the substrate temperature of a semiconductor substrate during the implant of protons. In this example, the substrate is heated by an external heater (e.g. heatable chuck or heatable substrate carrier) from room temperature 202 to a desired target temperature or process temperature 204. Then, the implantation of the protons starts and continues until the predefined dose of protons is implanted. The substrate may be actively cooled after the implantation (e.g. through the chuck or substrate carrier). Further, FIG. 2 indicates the external heat power 240, 250, 260 used for keeping the semiconductor substrate at the target temperature for different values of the beam current 210, 220, 230 used for implanting the protons. The temperature of the semiconductor substrate may be kept substantially constant due to the proposed temperature control. In comparison, FIG. 3 shows an example of a temperature profile 310 of the substrate temperature of a semiconductor substrate during the implant of protons without temperature control.

For example, the temperature of the semiconductor substrate may be controlled during the implantation 110 of the predefined dose of protons so that the temperature of the semiconductor substrate is within a target temperature range for more than 70% of an implant process time used for implanting the predefined dose of protons. The target temperature range may reach from a lower target temperature limit to an upper target temperature limit. The lower target temperature limit may be equal to a target temperature minus 30° C. (or minus 10° C. or minus 5° C.) and the upper target temperature limit may be equal to the target temperature plus 30° C. (or plus 10° C. or plus 5° C.). In other words, the temperature of the semiconductor substrate may be controlled to stay within a target temperature range of a target temperature +/−30° C., +/−10° C. or +/−5° C. for more than 70% of the implant process time used for implanting the predefined dose of protons. The target temperature may be higher than 80° C. (or higher than 120° C., higher than 150° C., higher than 200° C. or higher than 250° C.). For example, the lower target temperature limit may be higher than 80° C. as well.

For example, a doping of a first doping region within the semiconductor substrate is based on the implantation of the predefined dose of protons. The protons may be implanted so that the first region (e.g. field stop region or drift region) within the semiconductor substrate comprises a maximal concentration of hydrogen-related donors within the semiconductor substrate after forming the semiconductor device (e.g. and after tempering the semiconductor substrate to activate the hydrogen-related donors). For example, the maximal concentration of hydrogen-related donors is larger than $1*10^{15}$ cm$^{-3}$ (or larger than $2*10^{15}$ cm$^{-3}$ or larger than $3*10^{15}$ cm$^{-3}$ or larger than $1*10^{16}$ cm$^{-3}$).

Figure 4:
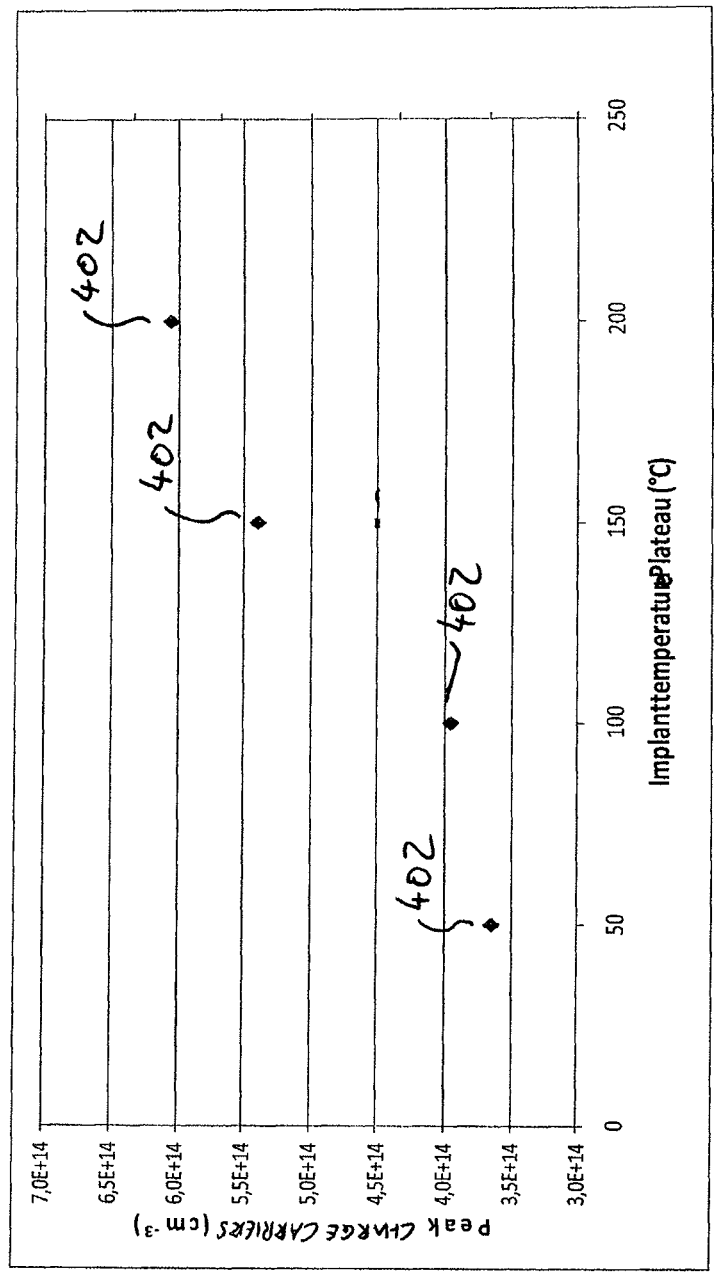
FIG. 4 shows a schematic illustration of a peak charge carrier concentration vs. implant temperature.

FIG. 4 shows examples for maximal doping concentrations 402 (peak charge carrier density) at the EoR peak (e.g. determined by spreading resistance profiling measurements, SRP). The dose of implanted protons may be substantially the same for all examples shown in FIG. 4. For example, for a specific doping process, FIG. 4 shows the final doping concentration in the EoR peak as a function of the implantation temperature using an FZ (float zone) substrate. For example, the doping concentration can be increased by constant tempering of the substrate to 200° C. by a factor of 2 (compared to a substrate implanted at 50° C.). In order to drastically increase the doping efficiency at a given dose, the substrate may be sufficiently heated, for example. The substrate temperature may be set by an externally heated chuck. In this way, the implantation dose may be reduced at a given target charge carrier concentration so that the costs may be reduced, for example.

For example, the first region caused by the proton implant (e.g. end of range region of the proton implant) may be located at a first depth with respect to a first surface of the semiconductor substrate used for implanting the protons into the semiconductor substrate. Further, a doping of a second doping region within the semiconductor substrate caused by the same proton implant may be based on the implantation of the predefined dose of protons. The second region may be located at a second depth with respect to the first surface of the semiconductor substrate. The first depth may be twice the second depth and the second region may comprise a concentration of hydrogen-related donors of less than 50% (or less than 20% or less than 10% or less than 5% or less than 1%) of the maximal concentration of hydrogen-related donors after forming the semiconductor device (e.g. and after tempering the semiconductor substrate to activate the hydrogen-related donors). The ratio between the concentration of hydrogen-related donors at the end of range of the proton implant and the concentration of hydrogen-related donors at one half of the end of range may depend on the substrate temperature during the proton implant. For example, the ratio between the concentration of hydrogen-related donors at the end of range of the proton implant and the concentration of hydrogen-related donors at one half of the end of range may be adjusted or selected by selecting a corresponding temperature of the substrate during the proton implantation.

Figure 5:
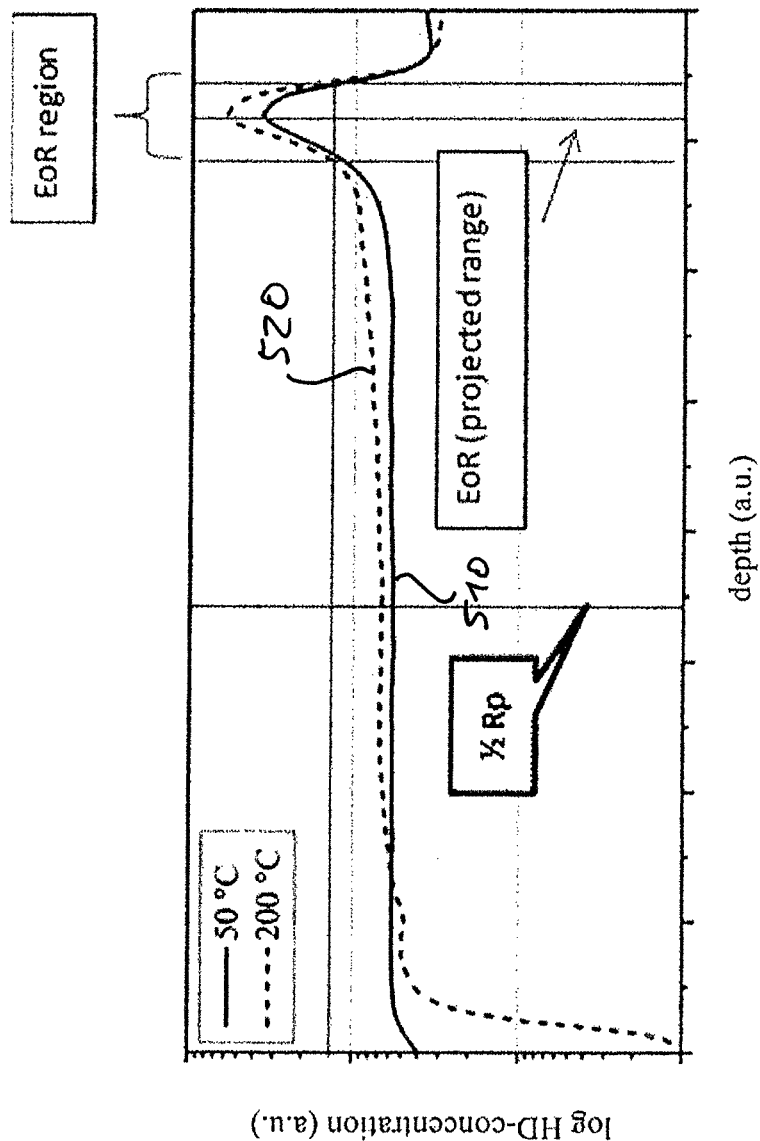
FIG. 5 shows a schematic illustration of a hydrogen donor concentration vs. substrate depth.

FIG. 5 shows schematic examples of hydrogen donor concentration profiles obtained for different substrate temperatures during proton implantation. A first profile 510 for a substrate temperature of 50° C. and a second profile for a substrate temperature of 200° C. are shown. The implant energy was selected so that a maximal concentration of hydrogen-related donors is located at a depth of 142 µm (e.g. EoR projected range). For example, the EoR region is indicated by Full Width at Half Maximum FWHM. Further, half of the depth (½ Rp) is indicated at 71 µm. The concentration of hydrogen-related donor is shown on a logarithmic scale in arbitrary units.

Figure 6:
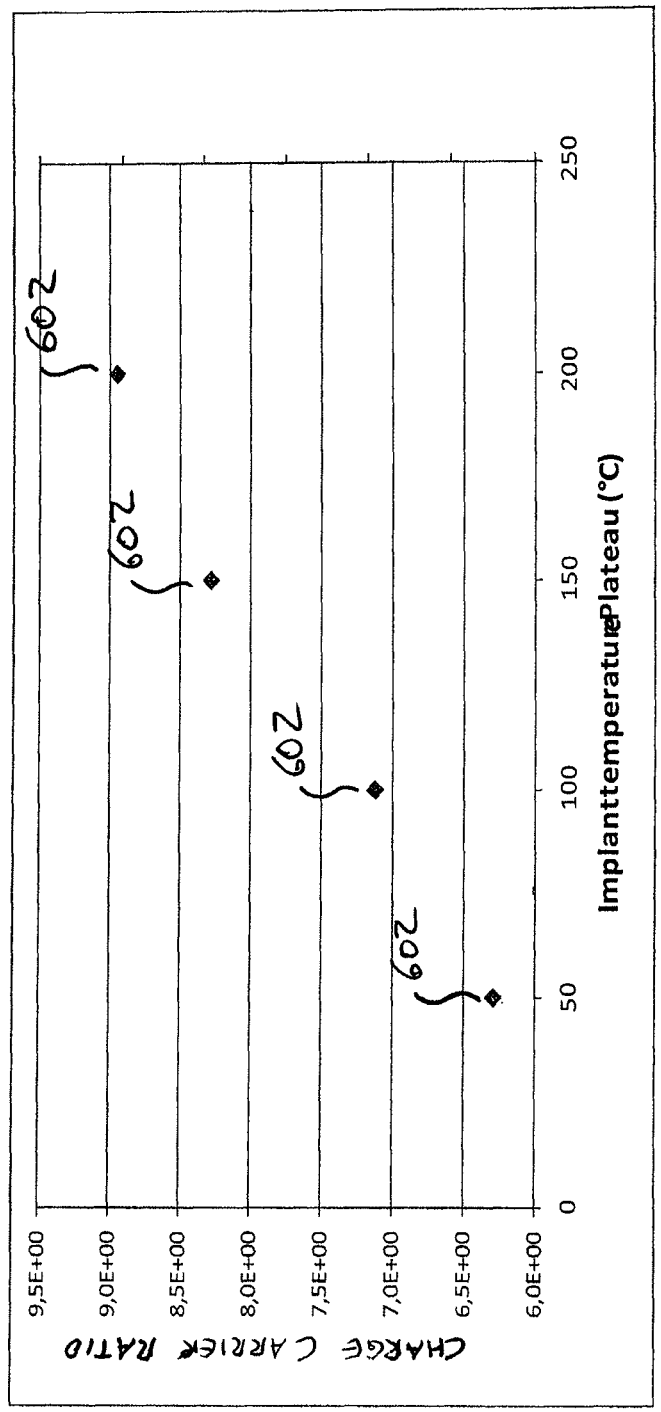
FIG. 6 shows a schematic illustration of a charge carrier ratio vs. implant temperature.

FIG. 6 shows schematic examples of charge carrier ratios 602 obtained for different substrate temperatures. The charge carrier ratios 602 are ratios between the doping concentrations at the end of range EoR peak (e.g. at 148 µm) and the concentrations in a depth of 70 µm (e.g. determined by spreading resistance profiling measurements, SRP). The proton beam currents 604 are measured during the implantation (beam current measured in an appropriately positioned faraday cup). The charge carrier ratios 602 are shown for different implant temperature plateaus (target temperature of semiconductor substrate). By regulating the temperature, the relationship between the EoR concentration and the charge carrier concentration in the irradiated area of the profile may be selectively adjusted as the strength of the effect of the temperature may depend on the local defect generation rate (nuclear interaction) during the implantation. In addition, the enhanced efficiency increase may allow an increase in the maximum feasible peak concentration using the proposed concept. With regard to very high doses, the maximum feasible concentration may be limited by the formation of higher-order defects. Due to the enhanced efficiency of formation of the desired donors, this limit may be altered to higher doses/concentrations such that higher peak concentrations may be achievable overall, for example.

For example, the implantation of the predefined dose of protons is performed to provide a field stop region or field stop layer of a vertical transistor arrangement or a vertical diode arrangement at a predefined depth. The field stop region may be located between a drift region and a backside doping region (e.g. drain region, collector region, cathode region or anode region) of a vertical transistor arrangement or a vertical diode arrangement. The field stop region may be located in a depth being reachable by protons with an energy of less than 2.5 MeV (or less than 1.5 MeV).

Optionally, a base doping (e.g. doping of the drift region of a transistor or a diode) of the semiconductor substrate and the field stop region may be implanted simultaneously. The implantation of the predefined dose of protons may be performed to provide simultaneously a base doping of the semiconductor substrate between the predefined depth and a surface of the semiconductor substrate. For example, the semiconductor substrate temperature may be selected so that the doping concentration obtained within the portion of the semiconductor substrate between the surface and the end of range peak of the proton implant (penetration area) forms the base doping of this portion and the end of range peak forms a doping concentration desired for the field stop region.

Alternatively, the implantation of the base doping (e.g. doping of the drift region of a transistor or a diode) of the semiconductor substrate may be performed independent or separate from the implant of the field stop region. The implantation of the base doping may be performed at higher implant energies (e.g. more than 3 MeV or more than 3.5 MeV). The end of range of the implantation of the base doping may be deeper than a thickness of the semiconductor substrate of the final semiconductor device (e.g. the end of range portion may be removed by grinding the substrate). The semiconductor substrate may reach very high temperatures, if proton energies higher than 3.5 MeV are used. The doping efficiency may be increased and/or the process time may be reduced by controlling (e.g. heating and/or cooling the substrate carrier or the process chamber) the temperature of the semiconductor substrate.

For example, a first proton implantation (implanting a first predefined dose of protons) may be performed from a front side of a semiconductor substrate with an implant energy of more than 2.5 MeV to form a doping of a drift region of a vertical transistor arrangement or a vertical diode arrangement. Then, the semiconductor substrate may be thinned from a back side of the semiconductor substrate. Thereby, the thinning may be performed in a way to completely remove the EoR region resulting from the first proton implantation. Optionally, the thinning may not reach the projected range of the first proton implantation, thus preserving the EoR region of the respective profile. Further, a second proton implantation (implanting a second predefined dose of protons) may be performed from the back side of the semiconductor substrate with an implant energy of less than 2.5 MeV after the thinning of the semiconductor substrate to form a doping of a field stop region of a vertical transistor arrangement or a vertical diode arrangement. Additional other steps may be performed before or after the first proton implantation, before or after the thinning and/or before or after the second proton implantation to form additional structures or regions of the vertical transistor arrangement or the vertical diode arrangement.

Additionally, the method 100 may comprise tempering the semiconductor substrate at a temperature of more than 300° C. (or more than 400° C. or more than 450° C.) for more than 1 h (or more than 4 h) after the implantation of the predefined dose of protons. The tempering may activate hydrogen-related donors by diffusing the hydrogen. However, the tempering may be performed at a temperature below 500° C. Temperatures larger than 500° C. may result in dissociation of hydrogen complexes and to a reduction of hydrogen-related donors.

The semiconductor device to be formed may comprise a vertical transistor arrangement or a vertical diode arrangement. For example, the vertical transistor arrangement may be a field-effect transistor arrangement (e.g. metal oxide semiconductor transistor or insulated gate bipolar transistor), for example. The vertical transistor arrangement may comprise a plurality of cells or repeated structures (e.g. field effect transistor cells, metal oxide semiconductor transistor cells or insulated gate bipolar transistor cells) within a cell field.

For example, a field effect transistor cell may comprise a source region, a body region, a drain region (e.g. shared with other cells) and a gate for controlling a channel through the body region. Further, the vertical transistor arrangement may comprise a field stop region or field stop layer between the body region (or drift region) and the drain region.

For example, the semiconductor device may be any semiconductor device using a region of hydrogen related donors. For example, the semiconductor device a power semiconductor device comprising a breakdown voltage or blocking voltage of more than more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V or 2000V).

Figure 7:
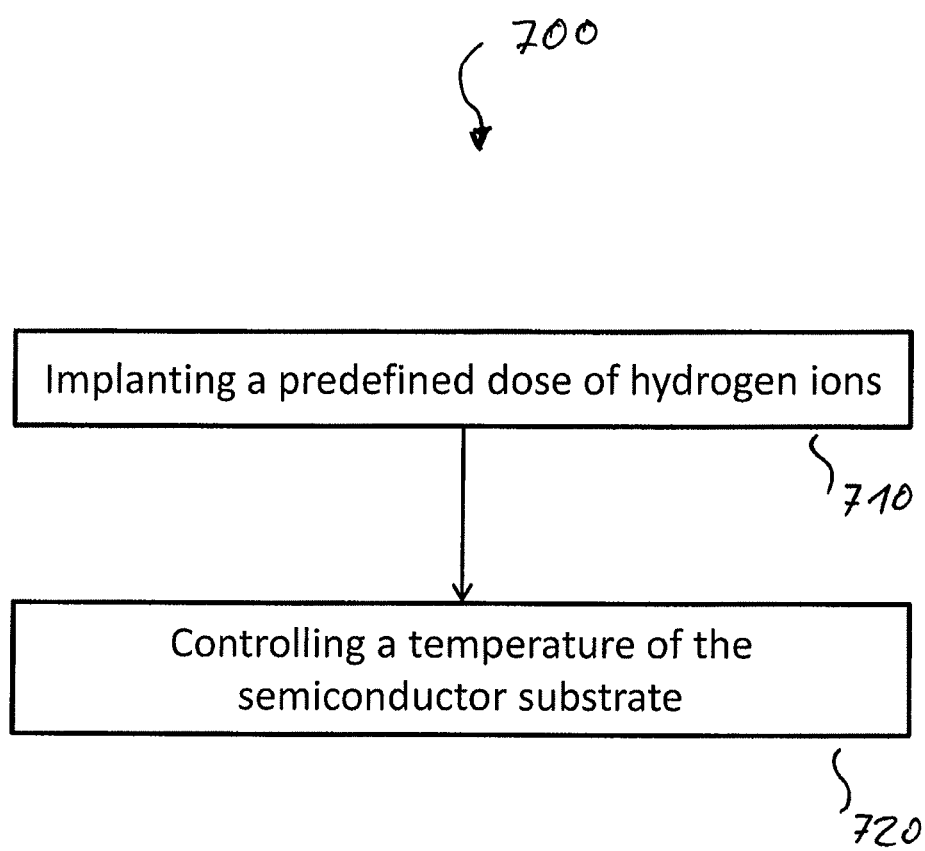
FIG. 7 shows another flow chart of a method for forming a semiconductor device.

FIG. 7 shows a flow chart of a method 700 for forming a semiconductor device according to an embodiment. The method 700 comprises implanting 710 a predefined dose of protons into a semiconductor substrate. Further, the method 700 comprises controlling 720 a temperature of the semiconductor substrate during the implantation of the predefined dose of protons so that the temperature of the semiconductor substrate is within a target temperature range for more than 70% of an implant process time used for implanting the predefined dose of protons. The target temperature range reaches from a lower target temperature limit to an upper target temperature limit. Further, the lower target temperature limit is equal to a target temperature minus 30° C. and the upper target temperature limit is equal to the target temperature plus 30° C. and the target temperature is higher than 80° C.

The doping efficiency of the implanted protons may be increased by increasing the temperature above 80° C. during the implant. In this way, a maximally reachable doping concentration may be increased and/or the process time required for implanting a desired dose of ions or for obtaining a desired doping concentration may be reduced. Further, the manufacturing costs may be reduced.

The temperature of the semiconductor substrate may be controlled 720 to stay within a target temperature range of a target temperature +/−30° C. (or +/−10° C. or +/−5° C.) for more than 70% (or more than 90% or more than 95%) of an implant process time used for implanting the predefined dose of protons. The target temperature may be higher than 80° C. (or higher than 120° C., higher than 150° C., higher than 200° C. or higher than 250° C.). For example, the lower target temperature limit may be higher than 80° C. as well.

Further, during the implantation of the predefined dose of protons, the target temperature may be kept below temperatures, which would destroy hydrogen-related donors or would reduce the efficiency for generating hydrogen-related donors. For example, the target temperature may be lower than 500° C. (or lower than 400° C. or lower than 300° C.).

The temperature of the semiconductor substrate may be controlled 720 in various ways. For example a substrate carrier may comprise a means for heating and/or cooling the semiconductor substrate during the implantation of the protons. Additionally or alternatively, the implantation system used for implanting the protons may comprise process chamber with a controllable temperature so that the temperature within the process chamber can be controlled during the proton implant. For example, the temperature of the semiconductor substrate may be measured (e.g. by a temperature sensor at the semiconductor substrate or by infrared temperature measurement) during the implantation of the predefined dose of protons and the temperature of the semiconductor substrate may be adjusted (e.g. by adjusting a heat power of a means for heating and/or cooling the semiconductor substrate or by adjusting a beam current of the protons) based on the measured temperature.

The protons can be accelerated by an ion implantation system to a desired energy. For example, the protons are accelerated to implantation energy of up to 4 MeV (or up to 5 MeV, up to 6 MeV or up to 10 MeV). The implantation energy of the protons may determine the depth of penetration and the doping profile in a vertical direction. For example, the implantation energy may be selected according to a desired depth of a maximum of hydrogen-related donors or an end of range of the implanted protons. For example, an implant energy of less than 1.6 MeV (1600 keV) may be sufficient for implementing doping regions (e.g. field stop region or drift region) of various electrical elements (e.g. transistor structure or diode structure). Alternatively, implantation energies between 3 MeV and 5 MeV may be used for forming a base doping of the semiconductor substrate. The temperature of the semiconductor substrate may be controlled by heating the semiconductor substrate depending on the beam current and beam energy during the implant process.

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIG. 1-6) or below (e.g. FIG. 8-10).

Figure 8:
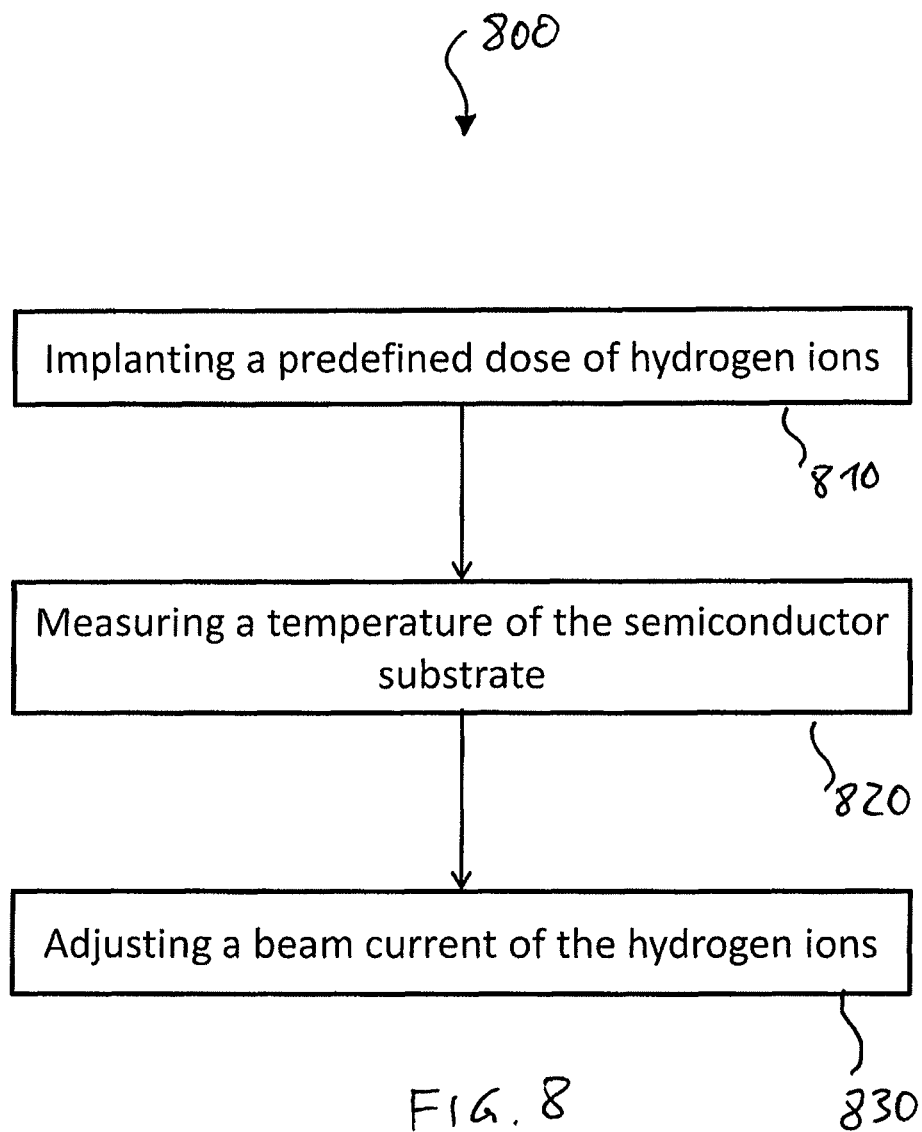
FIG. 8 shows another flow chart of a method for forming a semiconductor device.

FIG. 8 shows a flow chart of a method 800 for forming a semiconductor device according to an embodiment. The method 800 comprises implanting 810 a predefined dose of protons into a semiconductor substrate and measuring 820 a temperature of the semiconductor substrate during the implantation of the predefined dose of protons. Further, the method comprises adjusting 830 a beam current of the protons during the implantation based on the measured temperature.

The doping efficiency of the implanted protons may be increased by adjusting the beam current based on the temperature of the semiconductor substrate.

For example, the temperature of the semiconductor substrate may increase above 100° C. for implant energies of more than 3 MeV and high beam currents (e.g. more than 0.2 μA or more than 0.5 μA). The temperature of the semiconductor substrate can be kept within a desired target temperature range by adjusting the beam current.

For example, the beam current may be adjusted by increasing or decreasing the beam current without turning the beam off (reducing beam current to zero). For example, the beam current may be reduced (e.g. but not below 10% of a maximal beam current), if the temperature of the semiconductor substrate increases to or increases above an upper target temperature limit of a target temperature range, and may be increased, if the temperature of the semiconductor substrate decreases to or decreases below a lower target temperature limit of the target temperature range. For example, the beam current is adjusted within a range between a maximal beam current (used during the implantation of the predefined dose of protons) and at least 5% (or at least 20% or at least 50%) of the maximal beam current used during the implantation of the predefined dose of protons.

Optionally, the semiconductor substrate may be heated by a constant heat power and/or a predefined heat power profile. Deviations from a desired temperature profile of the semiconductor substrate may be compensated by adjusting the beam current based on the measured temperature of the semiconductor substrate.

For example, the beam current of the protons may be adjusted during the implantation so that the temperature of the semiconductor substrate is higher than 80° C. for more than 70% of an implant process time used for implanting the predefined dose of protons.

Figure 9:
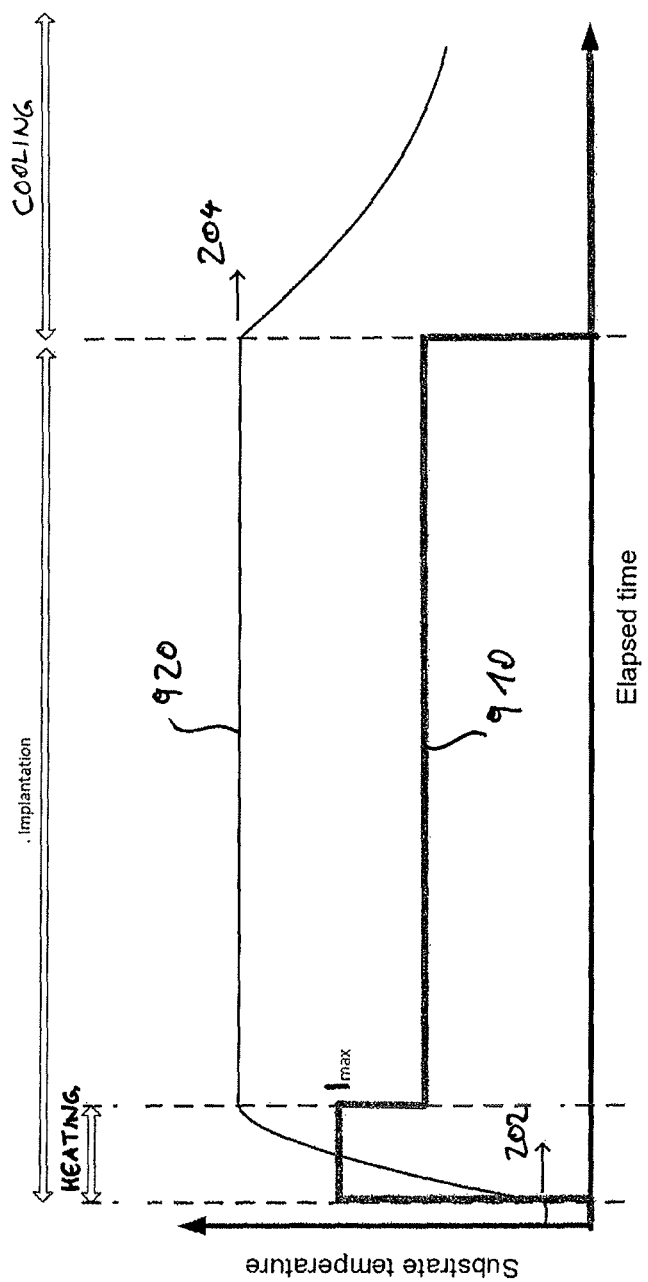
FIG. 9 shows a schematic illustration of a substrate temperature profile with temperature control.

FIG. 9 shows an example of a substrate temperature profile 920 with a temperature control by beam current adjustment. At the beginning of the proton implant the beam current 910 is selected very high ($I_{max}$) in order to heat the semiconductor substrate from room temperature 202 to a target temperature or process temperature 204. After reaching the target temperature, the beam current 910 is reduced to a lower current $I_{stable}$ in order to keep the semiconductor substrate within a target temperature range until the predefined dose of protons is implanted. Afterwards, the substrate cools down to room temperature 202 after switching off the proton beam.

More details and aspects are mentioned in connection with the embodiments described above or below. The embodiment shown in FIG. 8 may comprise one or more optional additional features corresponding to one or more aspects mentioned in connection with the proposed concept or one or more embodiments described above (e.g. FIG. 1-7) or below (e.g. FIG. 9-10).

Figure 10:
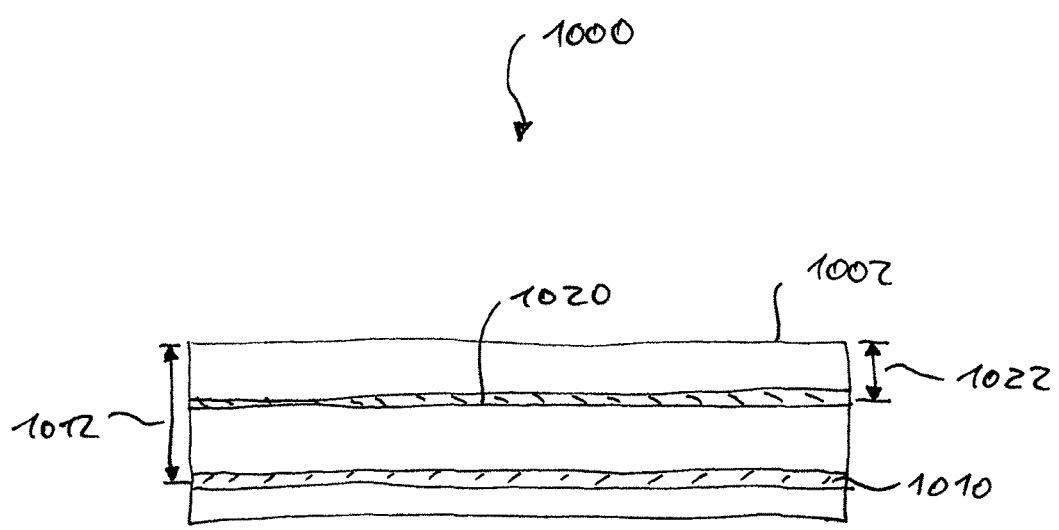
FIG. 10 shows a schematic cross section of a semiconductor device.

FIG. 10 shows a schematic cross section of a semiconductor device 1000 according to an embodiment. The semiconductor device 1000 comprises a first region 1010 within a semiconductor substrate caused by a proton implant. The first region 1010 comprises a maximal concentration of hydrogen-related donors within the semiconductor substrate. Further, the first region 1010 is located at a first depth 1012 with respect to a first surface 1002 of the semiconductor substrate. Additionally, the semiconductor device 1000 comprises a second region 1020 within the semiconductor substrate located at a second depth 1022 with respect to the first surface 1002 of the semiconductor substrate. The first depth 1012 is twice the second depth 1022 and the second region 1020 comprises a concentration of hydrogen-related donors caused by the same proton implant of less than 50% (or less than 20% or less than 10% or less than 5%) of the maximal concentration of hydrogen-related donors.

The ratio of hydrogen-related donors in a desired depth (first depth) and hydrogen-related donors between the surface and the desired depth may be increased by using an efficient implant method. The manufacturing costs may be reduced by forming devices with a large ratio.

The first surface 1002 of the semiconductor substrate is the surface from which the protons are implanted during manufacturing of the semiconductor device. The first surface 1002 (e.g. front side surface) of the semiconductor substrate may be a semiconductor surface of the semiconductor substrate towards metal layers, insulation layers or passivation layers on top of the semiconductor surface. In comparison to a basically vertical edge (e.g. resulting from separating the semiconductor substrate from others) of the semiconductor substrate, the surface of the semiconductor substrate may be a basically horizontal surface extending laterally. The surface of the semiconductor substrate may be a basically even plane (e.g. neglecting unevenness of the semiconductor structure due to the manufacturing process or trenches). In other words, the surface of the semiconductor substrate may be the interface between the semiconductor material and an insulation layer, metal layer or passivation layer on top of the semiconductor substrate.

For example, the first region may foam a field stop region or drift region of a vertical transistor arrangement (e.g. field effect transistor, bipolar transistor or insulated gate bipolar transistor) or a field stop region, a cathode region or an anode region a vertical diode arrangement.

For example, the maximal concentration of hydrogen-related donors is larger than $1*10^{15}$ cm$^{-3}$ (or larger than $2*10^{15}$ cm$^{-3}$ or larger than $3*10^{15}$ cm$^{-3}$ or larger than $1*10^{16}$ cm$^{-3}$).

More details and aspects are mentioned in connection with the embodiments described above or below. The embodiment shown in FIG. 10 may comprise one or more optional additional features corresponding to one or more aspects mentioned in connection with the proposed concept or one or more embodiments described above (e.g. FIG. 1-9) or below.

Some embodiments relate to a method for increasing the doping efficiency of a proton implantation and for partial manipulation of a proton doping profile.

The doping concentration reachable after a final activation act during the proton doping may be influenced by the substrate temperature and the dose rate. The dose rate (or beam current) may be adjusted high within certain limits to keep the process costs low. However, an increase of the dose rate may lead to a reduced donor conversion efficiency due to increased Frenkel-recombination during the implantation. For example, with an increasing dose rate, the density of collision cascades increases. Thus, cascade-cascade interactions may be more pronounced, in turn increasing the recombination rate. This effect may be compensated or partly compensated by a proposed increase of the substrate temperature (e.g. to values between 300 K and 600 K). The diffusion coefficient of the primary point defects increases with increasing temperature, for example. Thereby, the single collision cascades may decay faster, forming small point defect agglomerates, which later may form the precursors of the HDs. Thus, with higher implantation temperature the interaction between independent collision cascades may be reduced. In this way, during implantation, the formation of (vacancy related) point defect agglomerates may occur more pronounced referenced to the competing Frenkel-recombination process. Consequently, the dependency on the beam current may be reduced and the efficiency of HD-formation may be increased. The doping efficiency may be increased by more than 100% at ideal temperature conditions while other implantation parameters and/or annealing parameters may be kept equal. The implantation dose may be significantly reduced at a given target concentration, which may directly influence the process time positively and may allow cost savings. The effect may be more effective at the region of the maximal damage of the implantation profile than at the penetrated region up to the surface. For example, the higher effectivity is due to the increased cross section of nuclear damage events and the thus increased cascade density in the region of the maximal damage. However, at the penetrated region up to the surface, the cascade density may be much smaller at a given dose rate due to a reduced nuclear cross section in that region. Thus, the relative effect of an increased temperature may be less pronounced there. The ratio between the finally obtained doping concentration at the end of range (EoR) peak and within the penetrated zone (dZ) may be adjusted by a proposed control of the substrate temperature so that an additional degree of freedom may be available for the design of power semiconductor devices, for example.

The EoR concentration may be adjusted independent from the dZ concentration (within certain limits) by using the proposed concept. Further, a limitation of the maximal EoR concentration by the dose may be avoided, at which higher-order defect complexes from multiple-cascade processes exceed a critical density and become effective getter centers for further point defects. Thus, a decrease of the efficiency of formation of the desired hydrogen donor complexes as the dose is increased and a limitation of the maximum (economically) feasible donor concentration at the EoR may be avoided.

According to an aspect, a method in which the doping efficiency of a proton doping may be increased and/or controlled independent of the beam power by regulating the substrate temperature in a controlled manner is proposed. For example, degrees of freedom may hereby be gained in determining the relationship of the doping efficiency in the irradiated area and in the end-of-range.

According to an aspect, the proposed concept may result in a reduction of the process time and therefore the process costs. A squared dose dependency of the doping concentration results, e.g., in the EoR peak after a final tempering at 470° C. for 5 hours may be obtained by using other methods.

For example, post-implantation annealing at e.g. 470° C. may yield an approximately square-root dependence of the maximum doping concentration on the implanted proton dose. Hence, in order to increase the maximum doping concentration by, eg, 60%, as shown in FIG. 4, the proton dose would have to be increased by a factor of >2.5, for example.

For example, with correspondingly high beam powers, the substrate temperature may also be set in a reproducible manner directly via the desired implantation current. This system may be implemented in combination with an in-situ temperature measurement in the corresponding control software of an implantation system.

For example, with sufficient knowledge of the implantation temperature dependency of the finally achieved doping, scattering of the proton doping may be dramatically reduced by means of a repeatable regulation of the substrate temperature during the implantation.

A detection of a proposed method may be done by photoluminescence methods. The relationship of the doping concentration in the EoR peak relative to the irradiated zone may be measured, for example, by spreading resistance profiling SRP. The relative concentration of larger, proton implantation-specific defect complexes to V, V2 and VOx complexes may be measured by deep-level transient spectroscopy DLTS, for example.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The invention claimed is:

1. A method for forming a semiconductor device, the method comprising:

generating hydrogen-related donors, including implanting a predefined dose of protons into a semiconductor substrate to generate the hydrogen-related donors; and controlling a temperature of the semiconductor substrate during the implantation of the predefined dose of protons so that the temperature of the semiconductor substrate is within a target temperature range for more than 70% of an implant process time used for implanting the predefined dose of protons, wherein the target temperature range reaches from a lower target temperature limit to an upper target temperature limit, wherein the lower target temperature limit is equal to a target temperature minus 30° C. and the upper target temperature limit is equal to the target temperature plus 30° C., and wherein the target temperature is higher than 80° C.

2. The method according to claim 1, wherein a doping of a first doping region within the semiconductor substrate is based on the implantation of the predefined dose of protons, wherein the first region comprises a maximal concentration of hydrogen-related donors within the semiconductor substrate after forming the semiconductor device, and wherein the maximal concentration of hydrogen-related donors is larger than $3*10^{14} cm^{-3}$.

3. The method according to claim 1, wherein the implantation of the predefined dose of protons is performed to provide a field stop region of a vertical transistor arrangement or a vertical diode arrangement at a predefined depth.

4. The method according to claim 3, wherein the implantation of the predefined dose of protons is performed to provide simultaneously at least a part of a base doping of the semiconductor substrate between the predefined depth and a surface of the semiconductor substrate.

5. The method according to claim 1, wherein implanting the predefined dose of protons is performed from a front side of the semiconductor substrate with an implant energy of more than 2.5 MeV to form a doping of a drift region of a vertical transistor arrangement or a vertical diode arrangement, the method further comprising:

thinning the semiconductor substrate from a back side of the semiconductor substrate; and implanting a second predefined dose of protons from the back side of the semiconductor substrate with an implant energy of less than 2.5 MeV after the thinning of the semiconductor substrate to form a doping of a field stop region of a vertical transistor arrangement or a vertical diode arrangement.

6. The method according to claim 1, wherein a doping of a first doping region within the semiconductor substrate is based on the implantation of the predefined dose of protons, wherein the first region comprises a maximal concentration of hydrogen-related donors within the semiconductor substrate after forming the semiconductor device, and wherein the maximal concentration of hydrogen-related donors is larger than $1*10^{15} cm^{-3}$.

7. The method according to claim 6, wherein the maximal concentration of hydrogen-related donors is larger than $3*10^{15} cm^{-3}$.

8. The method according to claim 6, wherein the first region is located at a first depth with respect to a first surface of the semiconductor substrate used for implanting the protons into the semiconductor substrate, wherein a doping of a second doping region within the semiconductor substrate is based on the implantation of the predefined dose of protons, wherein the second region is located at a second depth with respect to the first surface of the semiconductor substrate, wherein the first depth is twice the second depth, and wherein the second region comprises a concentration of hydrogen-related donors of less than 20% of the maximal concentration of hydrogen-related donors in the first region after forming the semiconductor device.

9. The method according to claim 6, wherein the first region forms at least a part of a field stop region of a vertical transistor arrangement or a vertical diode arrangement.

10. The method according to claim 1, wherein controlling a temperature of the semiconductor substrate during the implantation of the predefined dose of protons comprises:

measuring a temperature of the semiconductor substrate during the implantation of the predefined dose of protons; and adjusting the temperature of the semiconductor substrate based on the measured temperature.

11. The method according to claim 1, further comprising tempering the semiconductor substrate at a temperature higher than 300° C. for more than 1 h after the implantation of the predefined dose of protons.

12. The method according to claim 1, wherein an implant energy of the protons is higher than 200 keV.

13. A method for forming a semiconductor device, the method comprising:

generating hydrogen-related donors, including implanting a predefined dose of protons into a semiconductor substrate with an implant energy of less than 2.5 MeV to generate the hydrogen-related donors; and controlling a temperature of the semiconductor substrate during the implantation of the predefined dose of protons so that the temperature of the semiconductor substrate is higher than 80° C. for more than 70%, of an implant process time used for implanting the predefined dose of protons.

14. The method according to claim 13, wherein the temperature of the semiconductor substrate is controlled during the implantation of the predefined dose of protons so that the temperature of the semiconductor substrate is within a target temperature range for more than 70% of the implant process time used for implanting the predefined dose of protons, wherein the target temperature range reaches from a lower target temperature limit to an upper target temperature limit, wherein the lower target temperature limit is equal to a target temperature minus 30° C. and the upper target temperature limit is equal to the target temperature plus 30° C., and wherein the target temperature is higher than 80° C.

15. The method according to claim 13, wherein the temperature of the semiconductor substrate is controlled during the implantation of the predefined dose of protons so that the temperature of the semiconductor substrate is higher than 120° C. for more than 70% of the implant process time used for implanting the predefined dose of protons.

16. The method according to claim 13, wherein the temperature of the semiconductor substrate is controlled during the implantation of the predefined dose of protons so that the temperature of the semiconductor substrate is higher than 80° C. for more than 90% of the implant process time used for implanting the predefined dose of protons.

17. The method according to claim 13, wherein the implant energy of the protons is less than 1.6 MeV.

18. A method for forming a semiconductor device, the method comprising:

generating hydrogen-related donors, including implanting a predefined dose of protons into a semiconductor substrate to generate the hydrogen-related donors;

measuring a temperature of the semiconductor substrate during the implantation of the predefined dose of protons; and adjusting a beam current of the protons during the implantation based on the measured temperature.

19. The method of claim 18, wherein the beam current of the protons during the implantation is adjusted so that the temperature of the semiconductor substrate is higher than 80° C. for more than 70% of an implant process time used for implanting the predefined dose of protons.

* * * * *